US011670689B2

(12) United States Patent
Tseng et al.

(10) Patent No.: US 11,670,689 B2
(45) Date of Patent: Jun. 6, 2023

(54) METHOD FOR ELIMINATING DIVOT FORMATION AND SEMICONDUCTOR DEVICE MANUFACTURED USING THE SAME

(71) Applicant: TAIWAN SEMICONDUCTOR MANUFACTURING COMPANY, LTD., Hsinchu (TW)

(72) Inventors: Yu-Wen Tseng, Hsinchu (TW); Po-Wei Liu, Hsinchu (TW); Hung-Ling Shih, Hsinchu (TW); Tsung-Yu Yang, Hsinchu (TW); Tsung-Hua Yang, Hsinchu (TW); Yu-Chun Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 6 days.

(21) Appl. No.: 17/471,722

(22) Filed: Sep. 10, 2021

(65) Prior Publication Data

US 2022/0359671 A1 Nov. 10, 2022

Related U.S. Application Data

(60) Provisional application No. 63/184,936, filed on May 6, 2021.

(51) Int. Cl.
*H01L 29/40* (2006.01)
*H01L 29/423* (2006.01)
*H01L 29/06* (2006.01)
*H01L 29/78* (2006.01)

(52) U.S. Cl.
CPC ........ *H01L 29/401* (2013.01); *H01L 29/0653* (2013.01); *H01L 29/423* (2013.01); *H01L 29/7823* (2013.01)

(58) Field of Classification Search
CPC . H01L 29/401; H01L 29/0653; H01L 29/423; H01L 29/7823; H01L 21/76224–76237; H01L 21/823481; H01L 21/823878; H01L 21/30604–30621; H01L 21/3063–30635; H01L 21/3065–30655; H01L 21/31055–31056; H01L 21/31111–31122
See application file for complete search history.

(56) References Cited

U.S. PATENT DOCUMENTS

| 2012/0139080 A1* | 6/2012 | Wang | H01L 28/91 257/532 |
| 2014/0001596 A1* | 1/2014 | Hu | H01L 21/02109 257/E21.546 |
| 2016/0322262 A1* | 11/2016 | Li | H01L 21/76229 |

(Continued)

*Primary Examiner* — Shahed Ahmed
(74) *Attorney, Agent, or Firm* — Birch, Stewart, Kolasch & Birch, LLP

(57) ABSTRACT

A method for eliminating divot formation includes forming an isolation layer; forming a conduction layer which has an upper inclined boundary with the isolation layer such that the conduction layer has a portion located above a portion of the isolation layer at the upper inclined boundary; etching back the isolation layer; and etching back the conduction layer after etching back the isolation layer such that a top surface of the etched conduction layer is located at a level lower than a top surface of the etched isolation layer.

20 Claims, 8 Drawing Sheets

(56) References Cited

U.S. PATENT DOCUMENTS

2018/0342416 A1* 11/2018 Sucher .............. H01L 21/76237
2019/0378844 A1* 12/2019 Chen ................ H01L 27/10897
2020/0203478 A1*  6/2020 Shank ............... H01L 21/76237

* cited by examiner

METHOD FOR ELIMINATING DIVOT FORMATION AND SEMICONDUCTOR DEVICE MANUFACTURED USING THE SAME

REFERENCE TO RELATED APPLICATION

This application claims priority of U.S. Provisional Application No. 63/184,936 filed on May 6, 2021, the contents of which is incorporated herein by reference in its entirety.

BACKGROUND

A bipolar-CMOS (complementary metal oxide semiconductor)-DMOS (double diffused metal oxide semiconductor) (BCD) process, which integrates bipolar, CMOS, and DMOS devices in one semiconductor chip, has been widely used to make power devices, such as a high voltage electrical device. There is a continuous need to further optimize the BCD process for improving the electrical performance of the power devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
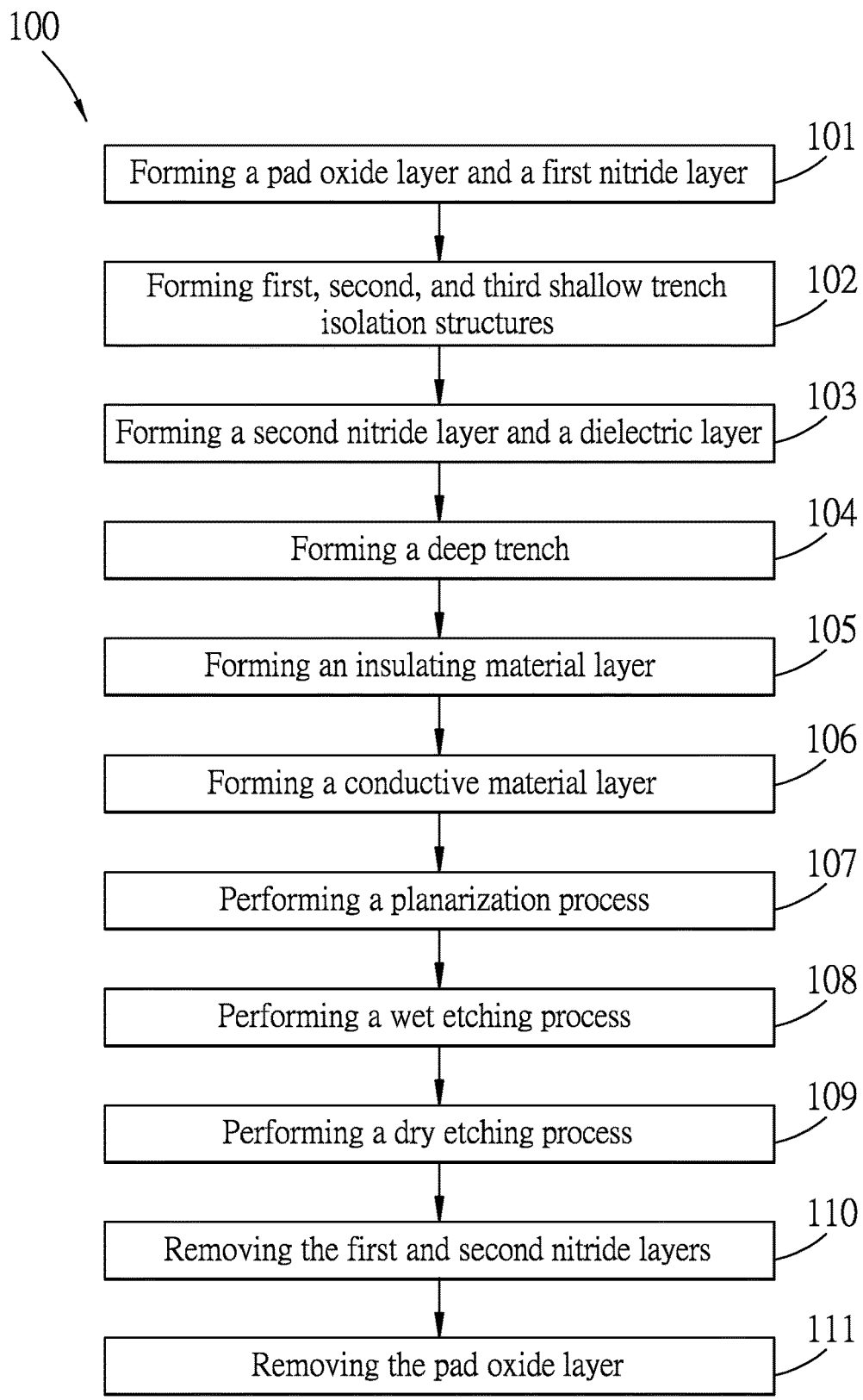
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Power metal oxide semiconductor field effect transistors (power MOSFETs) may be bipolar, complementary metal-oxide semiconductor (CMOS), and diffusion metal-oxide semiconductor (DMOS) devices (bipolar-CMOS-DMOS (BCD) devices), for example, but not limited to, LDMOS transistors (lateral diffused metal oxide semiconductor field effect transistors) or other suitable transistors/power devices.

A BCD device includes a semiconductor substrate, a shallow trench isolation (STI) structure, and a deep trench isolation (DTI) structure. The STI structure may be located at a first substrate portion of the semiconductor substrate, and the DTI structure may be located in the STI structure and may extend into a second substrate portion of the semiconductor substrate. A method for making the BCD device may involve etching back a conduction layer (e.g., polysilicon) of the DTI structure using dry etching, followed by etching back an isolation layer (e.g., dielectric oxide material) of the DTI structure using wet etching. In this case, the BCD device may have a divot (i.e., depression) because the isolation layer exposed from the etched conduction layer is isotropic etched during wet etching. As such, the etched isolation layer has a depressed region relative to the top surface of the etched conduction layer at a boundary between the isolation layer and the conduction layer. Afterwards, a residue of the floating gate material (e.g., polysilicon) for a flash device may remain in the depressed region, resulting in high leakage current of the BCD device. To prevent the residue of the floating gate material, the etched conduction layer may be etched back again using dry etching, such that a top surface of the etched conduction layer is located at a same level as the depressed region of the etched isolation layer.

The present disclosure is directed to a method for eliminating divot formation and a semiconductor device manufactured using the method. The semiconductor device may be used in, for example, but not limited to, a 55 nanometer (N55) generation device, a 28 nanometer (N28) generation device, a 20 nanometer (N20) generation device, a 16 nanometer (N16) generation device, or other generation devices.

FIG. 1 is a flow diagram illustrating a method 100 for manufacturing a semiconductor device in accordance with some embodiments. FIGS. 2 to 13 illustrate schematic views of the intermediate stages of the method 100.

Figure 2:
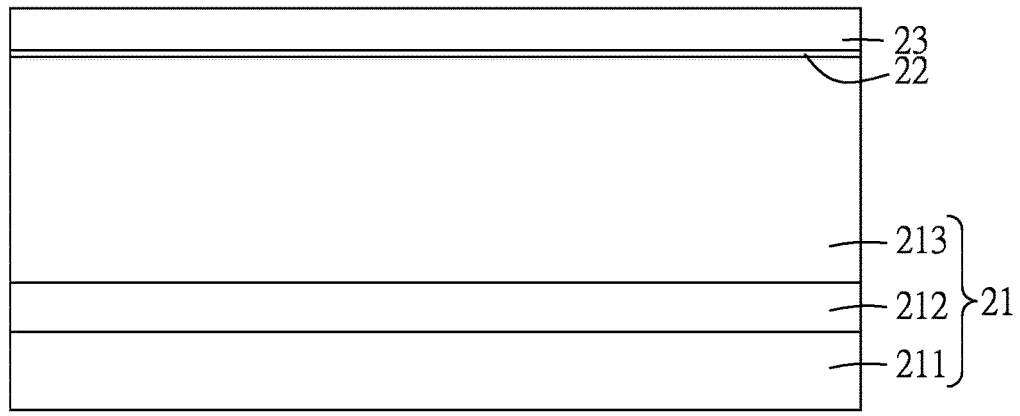
FIGS. 2 to 13 are schematic views illustrating intermediate stages of the manufacturing method in accordance with some embodiments as depicted in FIG. 1.

Referring to FIGS. 1 and 2, the method 100 begins at step 101, where a pad oxide layer 22 and a first nitride layer 23 are sequentially formed on a semiconductor substrate 21. The semiconductor substrate 21 may include a lower semiconductor layer 211, a buried insulation layer 212 (e.g., a buried oxide layer (BOX)), and an upper semiconductor layer 213. In some embodiments, the semiconductor substrate 21 may be, for example, a part of a silicon-on-insulator (SOI) substrate, an SOS (silicon-on-sapphire) substrate, or other suitable substrates. In some embodiments, the lower semiconductor layer 211 may be an elemental semiconductor or a compound semiconductor. The elemental semiconductor may be composed of single species of atoms, such as silicon (Si) and germanium (Ge) in column 14 of the periodic table, or other suitable materials. The compound semiconductor may be composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or other suitable materials. The buried insulation layer 212 between the lower semiconductor layer 211 and the upper semiconductor layer 213 may be formed by, for example, but not limited to, SOI techniques, such as implanted oxygen techniques (SIMOX), bonded-and-etch-back techniques (BESOI), or other suitable techniques. In some embodiments, the buried insulation layer 212 may be made of, for example, silicon oxide, or other suitable oxide materials. In some embodiments, the upper semiconductor layer 213 and the lower semiconductor layer 211 may be made of the same material. The pad oxide layer 22 is formed over the upper semiconductor layer 213 opposite to the buried insulation layer 212. In some embodiments, the pad oxide layer 22 is formed using, for example, chemical vapor deposition (CND), physical vapor deposition (PVD), atomic layer deposition (ALD), or other suitable deposition techniques. In alternative embodiments, the pad oxide layer 22 may be formed by thermally oxidizing the upper semiconductor layer 213 in an oxygen-containing atmosphere. The pad oxide layer 22 may include silicon oxide. Other suitable materials for the pad oxide layer 22 are within the contemplated scope of the present disclosure. The first nitride layer 23 is formed over the pad oxide layer 22 opposite to the upper semiconductor layer 213 using, for example, CVD, PVD, ALD, or other suitable deposition techniques. The first nitride layer 23 may include silicon nitride. Other suitable materials for the first nitride layer 23 are within the contemplated scope of the present disclosure. The first nitride layer 23 may have a thickness ranging from about 800 Å to about 1200 Å, but other range values are also within the scope of the disclosure.

Figure 3:
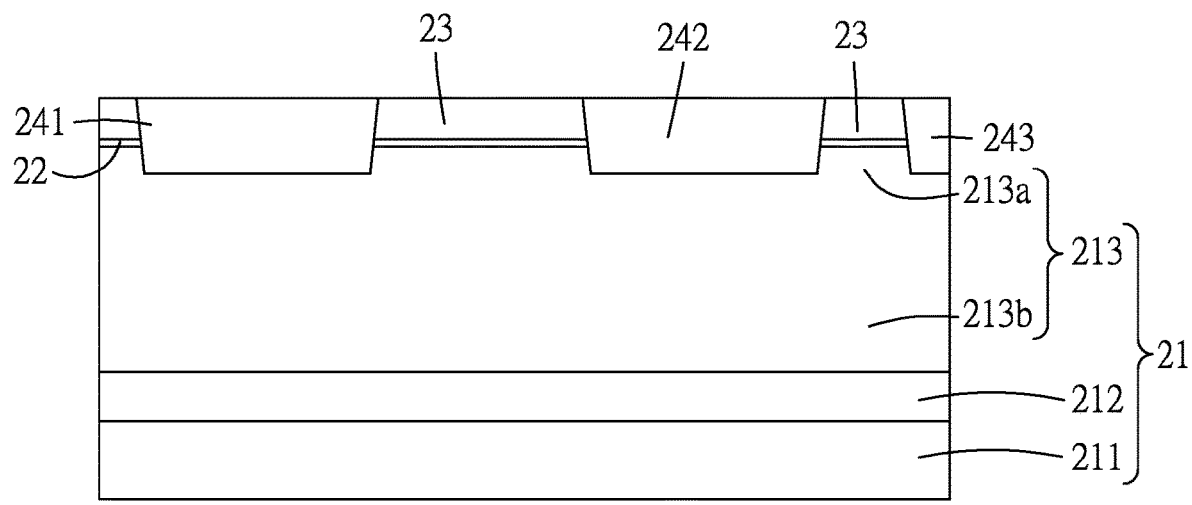

Referring to FIGS. 1 and 3, the method 100 proceeds to step 102, where first, second, and third STI structures 241, 242, 243 are formed in the structure shown in FIG. 2 and are spaced apart from each other. In some embodiments, the first, second, and third STI structures 241, 242, 243 are located at a first substrate portion 213a of the semiconductor substrate 21. In some embodiments, the upper semiconductor layer 213 may include the first substrate portion 213a which has a top surface of the upper semiconductor layer 213. Step 102 may include (i) forming a patterned mask (not shown) on the first nitride layer 23 shown in FIG. 2 to partially expose the first nitride layer 23, (ii) etching the first nitride layer 23, the pad oxide layer 22, and the first substrate portion 213a of the upper semiconductor layer 213 through the patterned mask to form shallow trenches (not shown), (iii) filling the shallow trenches with an oxide material, for example, silicon dioxide or other suitable oxide materials, and (iv) removing an excess of the oxide material on the etched first nitride layer 23 using, for example, chemical mechanical polish (CMP) or other suitable techniques. The patterned mask may include a photoresist material or other suitable mask materials, and may be formed by coating a photoresist layer, soft-baking, exposing the photoresist layer through a photomask, post-exposure baking, and developing the photoresist layer, followed by hard-baking to thereby obtain the patterned mask. In some embodiments, each of the first, second, and third STI structures 241, 242, 243 may have a height ranging from about 240 Å to about 360 Å, but other range values are also within the scope of the disclosure.

Figure 4:
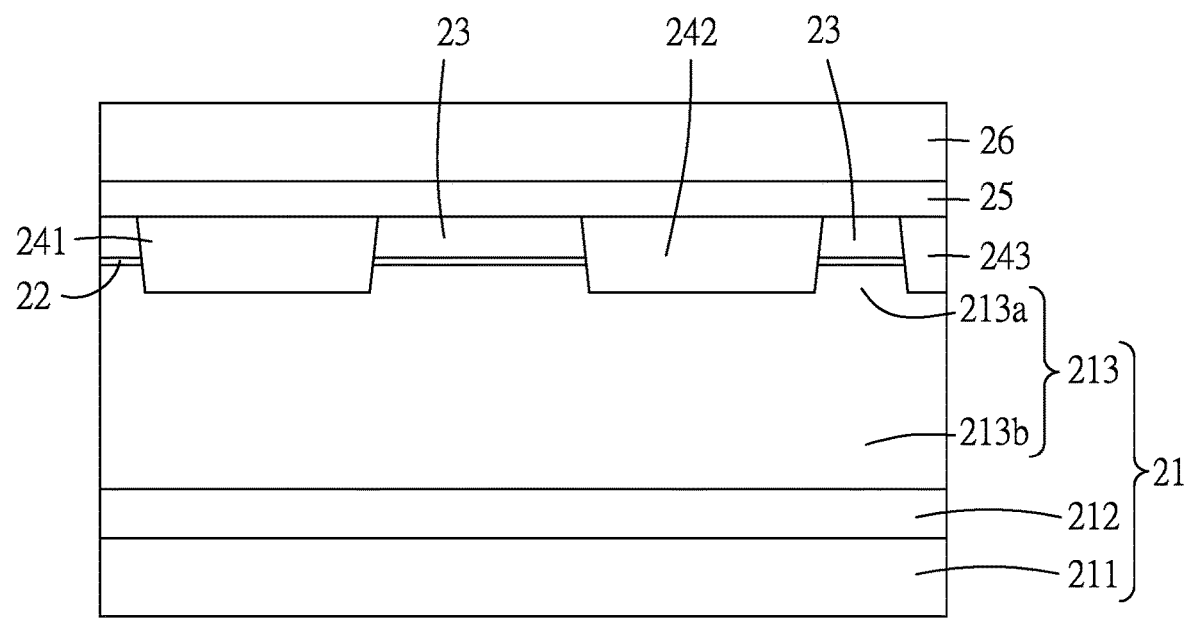

Referring to FIGS. 1 and 4, the method 100 proceeds to step 103, where a second nitride layer 25, and a dielectric layer 26 are sequentially formed on the structure shown in FIG. 3. The second nitride layer 25 is formed on the etched first nitride layer 23 and the first, second, and third STI structures 241, 242, 243 opposite to the upper semiconductor layer 213 using, for example, CVD, PVD, ALD, or other suitable deposition techniques. The second nitride layer 25 may include silicon nitride. Other suitable materials for the second nitride layer 25 are within the contemplated scope of the present disclosure. The second nitride layer 25 may have a thickness ranging from about 1120 Å to about 1680 Å, but other range values are also within the scope of the disclosure. The dielectric layer 26 is formed on the second nitride layer 25 opposite to the etched first nitride layer 23 using, for example, CVD, PVD, ALD, or other suitable deposition techniques. The dielectric layer 26 may include undoped silicate glass (USG). Other suitable dielectric materials for the dielectric layer 26 are within the contemplated scope of the present disclosure.

Figure 5:
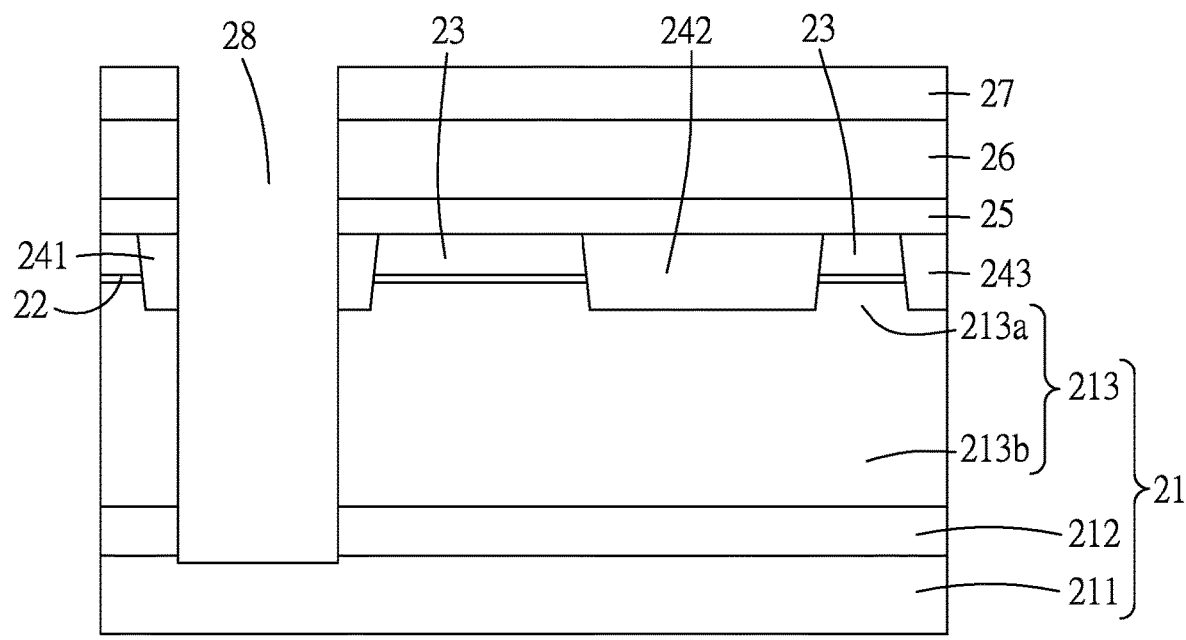

Referring to FIGS. 1 and 5, the method 100 proceeds to step 104, where the dielectric layer 26, the second nitride layer 25, the first STI structure 241, the upper semiconductor layer 213, the buried insulation layer 212, and the lower semiconductor layer 211 are etched and patterned through a first patterned mask 27 to form a deep trench 28. In this step, the deep trench 28 extends through the dielectric layer 26, the second nitride layer 25, the first ST1 structure 241, a second substrate portion 213b of the upper semiconductor layer 213, and the buried insulation layer 212, into the lower semiconductor layer 211. Step 104 may be performed using, for example, wet etching, dry etching, a combination thereof, or other suitable etching techniques. The materials and processes for forming the first patterned mask 27 are similar to those of the patterned mask as described in step 102, and therefore, the details thereof are omitted for the sake of brevity. After the formation of the deep trench 28, the first patterned mask 27 may be removed.

Figure 6:
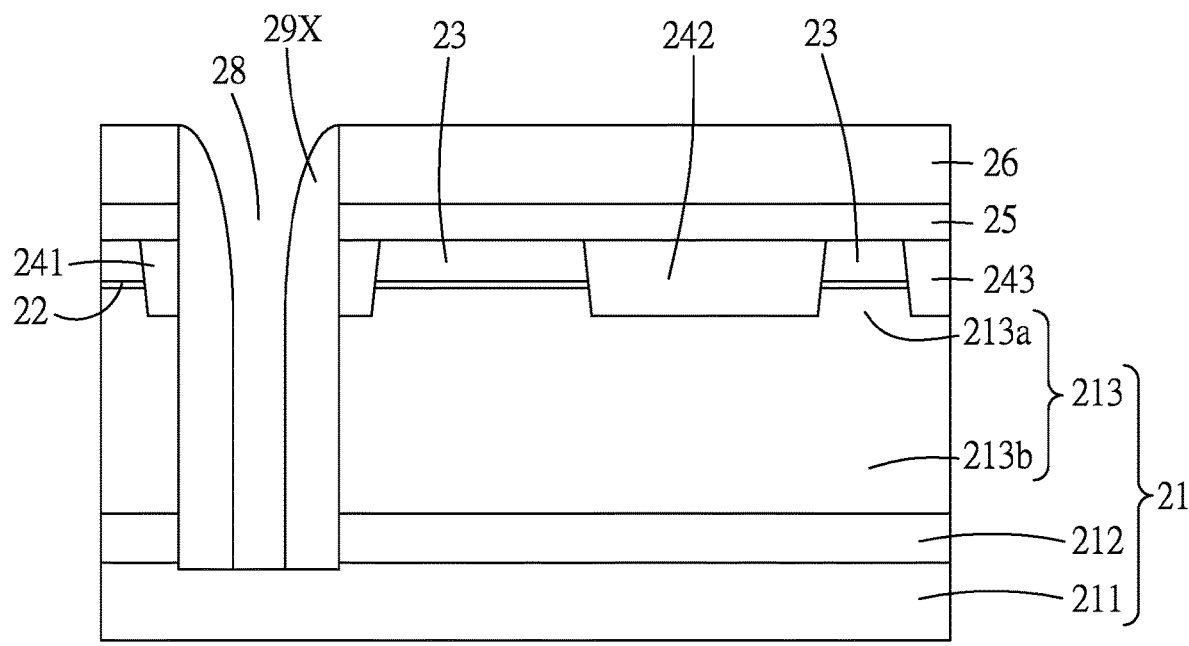

Referring to FIGS. 1 and 6, the method 100 proceeds to step 105, where an insulating material layer 29X is formed on two opposite trench-defining sidewalk of the deep trench 28. Step 105 may include (i) conformally depositing an insulating material for the insulating material layer 29X (not shown) over the structure shown in FIG. 5 using, for example, CND, PVD, or other suitable deposition techniques, and (ii) anisotropically etching (e.g., dry etching, wet etching, a combination thereof, or other suitable etching techniques) the insulating material to remove the insulating material on the patterned dielectric layer 26 and a bottom surface of the deep trench 28 to thereby form the insulating material layer 29X on the two opposite trench-defining sidewalls of the deep trench 28. The insulating material layer 29X may include silicon oxide, or silicon oxynitride. Other suitable materials for the insulating material layer 29X are within the contemplated scope of the present disclosure. In this step, the dielectric layer 26 underlying the insulating material may also be etched back.

Figure 7:
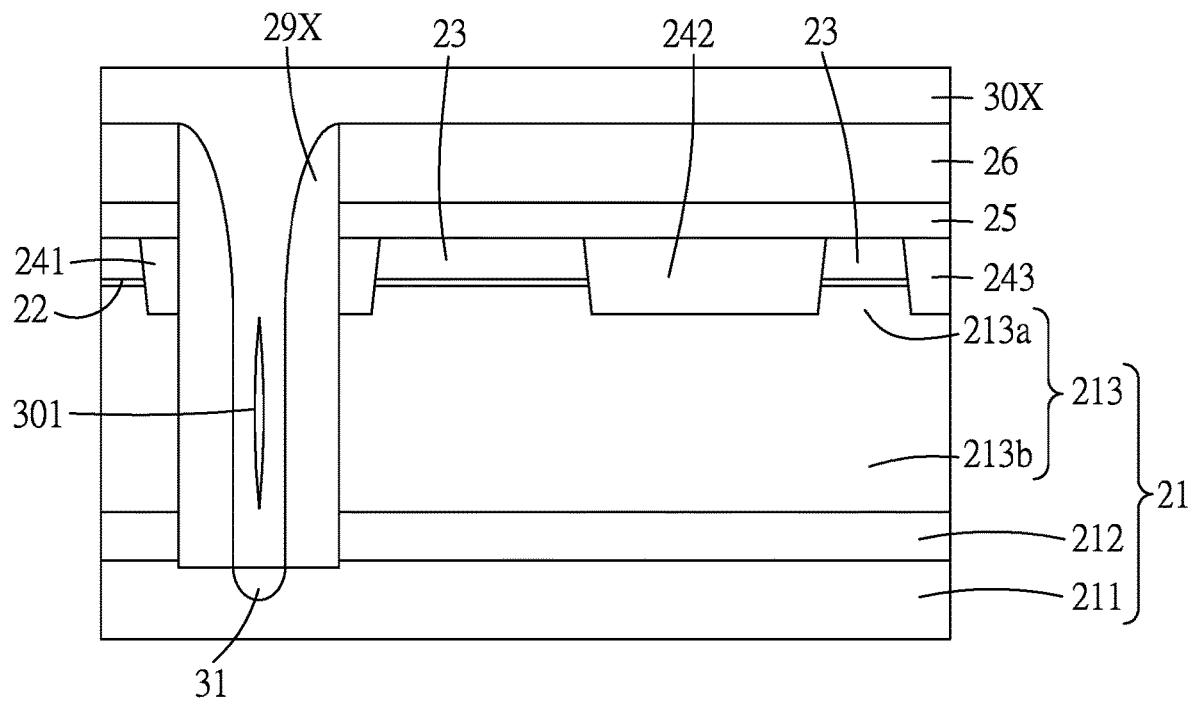

Referring to FIGS. 1 and 7, the method 100 proceeds to step 106, where a conductive material layer 30X is formed over the structure shown in FIG. 6. Step 106 may be performed by depositing a conductive material over the structure shown in FIG. 6 using, for example, CVD, PVD, ALD, or other suitable deposition techniques, to fill the deep trench 28 (see FIG. 6). The conductive material layer 30X may include polysilicon. In the deep trench 28, the conductive material layer 30X is connected to the lower semiconductor layer 211. In the formation of the conductive material layer 30X that fills the deep trench 28, a seam 301 may be formed in the conductive material layer 30X. In some embodiments, before the formation of the conductive material layer 30X, a doping region 31 may be formed in the lower semiconductor layer 211 using, for example, ion implantation or other suitable doping techniques. The doping region 31 may be formed using a P-type dopant (e.g., B, Al, or Ga) in some embodiments, and may be formed using an N-type dopant (e.g., P, Sb, or As) in other embodiments. In some embodiments, the doping region 31 may be formed using a doping energy ranging from about 5000 eV to about 10000 eV, but other doping energy ranges are also within the scope of the disclosure. In some embodiments, a doping concentration of the doping region 31 may range from about $1 \times 10^{13}/cm^3$ to about $1 \times 10^{15}/cm^3$, but other concentration ranges are also within the scope of the disclosure. In some embodiments, the doping region 31 and the conductive material layer 30X may have an identical doping type. The doping region 31 is used to enhance electrical connection between a conduction layer 30 (shown in FIG. 8, and formed from the conductive material layer 30X) and the lower semiconductor layer 211.

Figure 8:
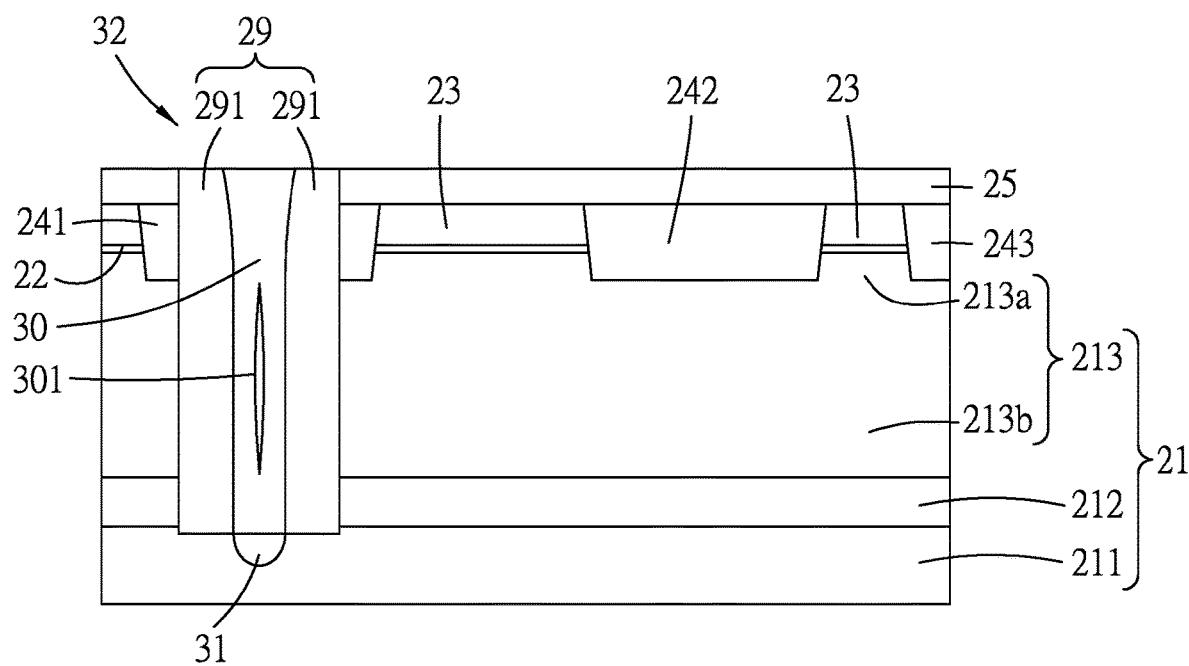

Referring to FIGS. 1 and 8, the method 100 proceeds to step 107, where a planarization process is performed to remove an upper portion of the conductive material layer 30X, the dielectric layer 26, and an upper portion of the insulating material layer 29X using, for example, CMP, or other suitable techniques. In step 107, the insulating material layer 29X (see FIG. 7) is formed into an isolation layer 29, and the conductive material layer 30X (see FIG. 7) is formed into the conduction layer 30, and the isolation layer 29 and the conduction layer 30 together form a deep trench isolation (DTI) structure 32. The isolation layer 29 includes two isolation portions 291 disposed at two opposite sides of the conduction layer 30 so as to separate the conduction layer 30 from the first and second substrate portions 23a, 213b. In some embodiments, the conduction layer 30 may have an upper inclined boundary with the isolation layer 29 such that the conduction layer 30 may have a portion located above a portion of the isolation layer 29 at the upper inclined boundary.

Figure 9:
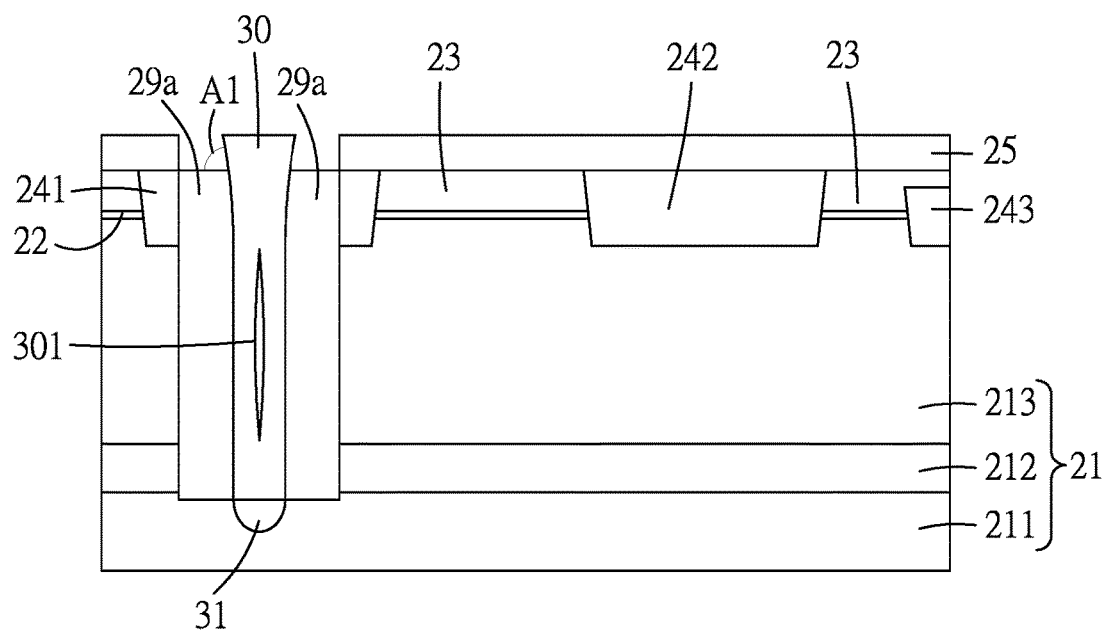

Referring to FIGS. 1 and 9, the method 100 proceeds to step 108, where the isolation layer 29 of the DTI structure 32 shown in FIG. 8 is etched back using wet etching to form an etched isolation layer 29a. In some embodiments, step 108 may be performed by immersing the structure shown in FIG. 8 in an etchant, for example, hydrofluoric acid, or other suitable etchants. In some embodiments, a concentration ratio of water to hydrogen fluoride (HF) in the hydrofluoric acid may range from about 40:1 to about 200:1, such as about 50:1. In some embodiments, the wet etching treatment time may range from about 600 seconds to about 1000 seconds, such as about 800 seconds. Step 108 may be performed until a top surface of the etched isolation layer 29a is substantially flush with a top surface of the first STI structure 241. In some embodiments, the top surface of the etched isolation layer 29a may be located at a level slightly higher or lower than the top surface of the first STI structure 241, and a height difference between the top surface of the etched isolation layer 29a and the top surface of the first STI structure 241 may range from 0 Å to about 250 Å. In some embodiments, an etching amount of the isolation layer 29 may range from about 900 Å to about 1200 Å. In some embodiments, after step 108, an included angle (A1) is formed between a lateral exposed portion of the conduction layer 30 and the top surface of the etched isolation layer 29a, and may be greater than about 45 degrees and smaller than about 90 degrees. It should be noted that during the isotropic wet etching of the isolation layer 29, a lateral surface of the isolation layer 29 is not exposed from the conduction layer 30, and thus, the isolation layer 29 may be etched evenly and downwardly.

Figure 10:
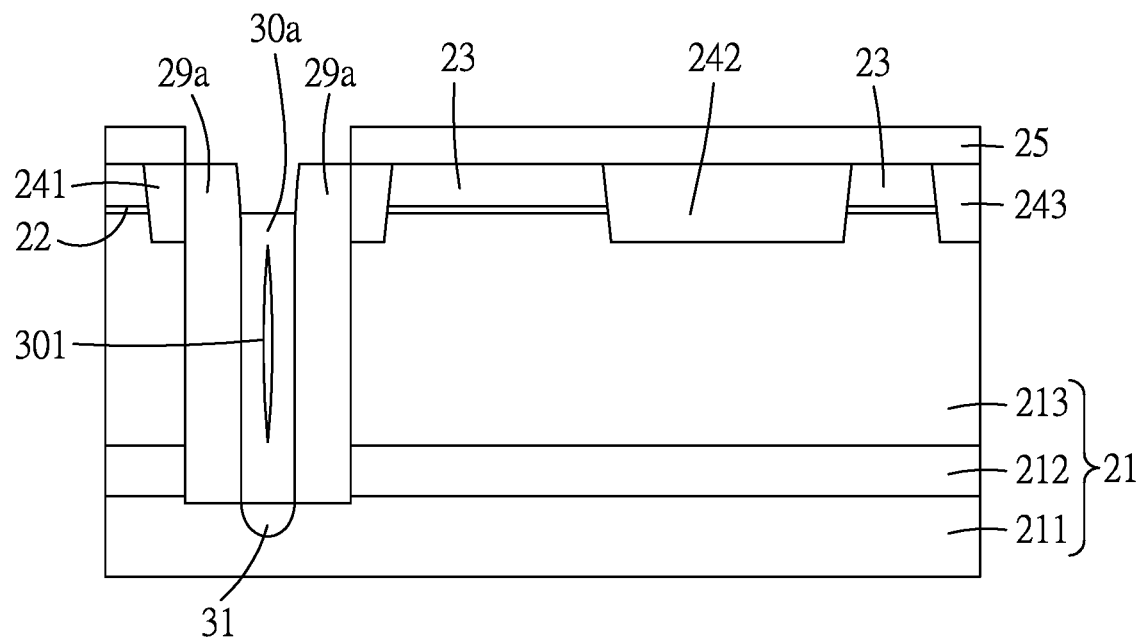

Referring to FIGS. 1 and 10, the method 100 proceeds to step 109, where the conduction layer 30 of the DTI structure 32 shown in FIG. 9 is etched back using dry etching to form an etched conduction layer 30a. In some embodiments, step 109 may be performed using an etchant for polysilicon or other suitable etchants. In some embodiments, the dry etching treatment time may range from about 40 seconds to about 100 seconds, such as about 70 seconds. After step 109, a top surface of the etched conduction layer 30a may be lower than the top surface of the etched isolation layer 29a. In some embodiments, a height difference between the top surface of the conduction layer 30a and the top surface of the isolation layer 29a may range from about 900 Å to about 1200 Å. In other words, an etching amount of the conduction layer 30 may range from about 1800 Å to about 2400 Å. In some embodiments, step 109 is performed until the top surface of the etched conduction layer 30a is located at a substantially same level as the top surface of the upper semiconductor layer 213. In some embodiments, the top surface of the etched conduction layer 30a may be located at a level slightly higher or lower than the top surface of the upper semiconductor layer 213, and a height difference between the top surface of the etched conduction layer 30a and the top surface of the upper semiconductor layer 213 may range from 0 Å to about 300 Å. In some embodiments, the top surface of the etched conduction layer 30a may be located at a level higher than an upper portion of the seam 301. In some embodiments, after step 109, the etched isolation layer 29a has an inclined lateral surface 29' exposed from the etched conduction layer 30a (see FIG. 12 below). It should be noted that because the dry etching in step 109 is anisotropical dry etching, the conduction layer 30 can be etched evenly and downwardly to expose the inclined lateral surface 29'.

Figure 11:
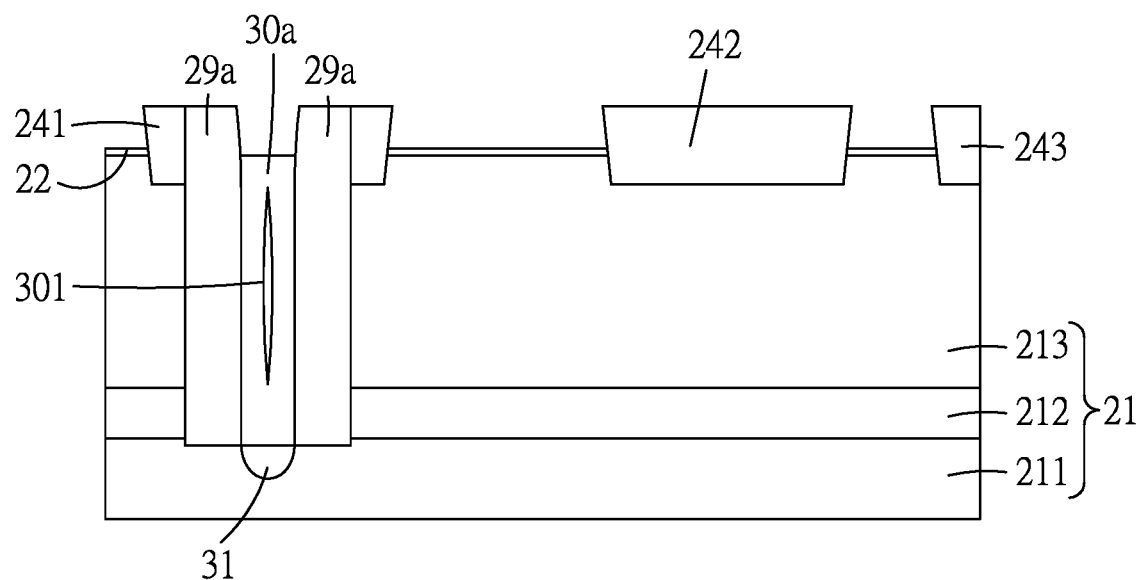
Figure 12:
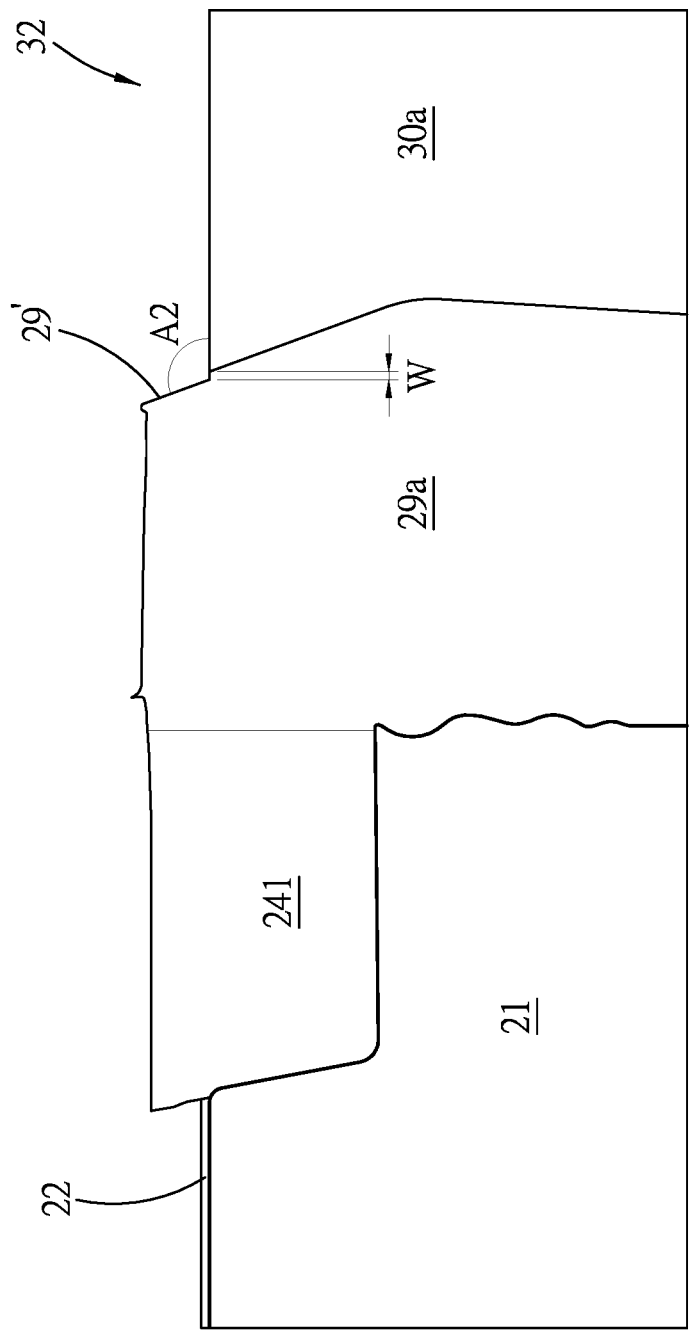
Figure 13:
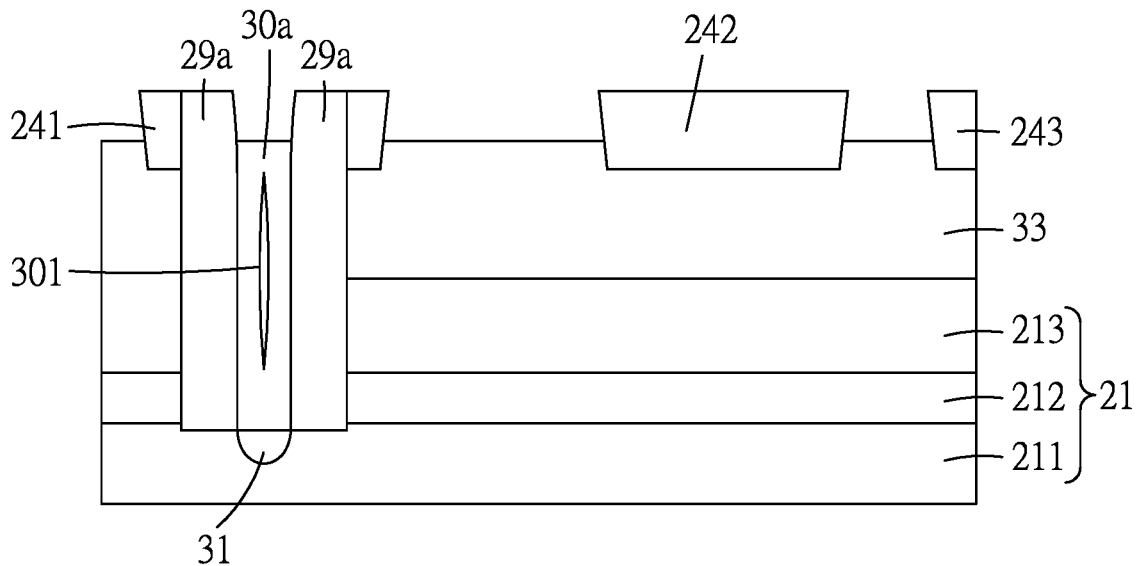

Referring to FIGS. 1 and 11, the method 100 proceeds to step 110, where the second nitride layer 25 and the first nitride layer 23 shown in FIG. 10 are removed. Step 110 may be performed by immersing the structure shown in FIG. 10 in an etchant, for example, phosphoric acid or other suitable etchants. FIG. 12 is a fragmentary enlarged view of FIG. 11. As shown in FIG. 12, in some embodiments, the etched isolation layer 29a may further have an interconnecting region which interconnects the inclined lateral surface 29' and the top surface of the etched conduction layer 30a, and which has a width (W) in a range from 0 Å to about 100 Å. In some embodiments, the width (W) may be 0 Å, and the inclined lateral surface 29' may be in alignment with the upper inclined boundary between the etched conduction layer 30a and the etched isolation layer 29a, In some embodiments, an included angle (A2) between the inclined lateral surface 29' of the etched isolation layer 29a and the top surface of the etched conduction layer 30a may be greater than about 90 degrees and smaller than about 135 degrees. In some embodiments, the included angle (A2) may be in a range of about 106 degrees to about 118 degrees. In some embodiments, the top surface of the etched isolation layer 29a may be formed with some bumps.

Referring to PICS. 1 and 13, the method 100 proceeds to step 111, where the pad oxide layer 22 shown in FIG. 11 is removed. Step 111 may be performed by immersing the structure shown in FIG. 11 in an etchant, for example, hydrofluoric acid, or other suitable etchants. The concentration ratio value of the hydrofluoric acid is similar to that of the hydrofluoric acid described in step 108, and therefore, the details thereof are omitted for the sake of brevity. After step 111, a pre-clean process (e.g., B Clean) may be conducted to clean the structure shown in FIG. 13 using chemical agents, for example, a sulfuric acid/hydrogen peroxide/deionized water (i.e., sulfuric peroxide mixture or SPM), a hydrofluoric acid/deionized water, an ammonium hydroxide/hydrogen peroxide/deionized water (i.e., ammonium peroxide mixture or APM), a hydrochloric acid/hydrogen peroxide/deionized water (i.e., hydrochloric peroxide mixture or HPM), combinations thereof, or other suitable chemical agents.

In this disclosure, the isotropic etching back of the isolation layer 29 is performed before the anisotropic etching back of the conduction layer 30, and a divot is less likely to be formed. On the contrary, if the isotropic etching back of the isolation layer 29 is performed after the anisotropic etching back of the conduction layer 30, a lateral surface of the isolation layer 29 exposed from the etched conduction layer 30 and above the upper inclined boundary will be etched to form a divot, and thus, a further etching back of the etched conduction layer may be used to alleviate the divot. As such, with the provision of the method 100 of the disclosure, the divot may not be formed, which is conducive for improving the performance of the semiconductor device, and further etching back of the conduction layer may not be necessary, which is conducive for reducing manufacturing cost for the semiconductor device.

Furthermore, a floating gate material (not shown) for a flash device may thereafter formed on the structure shown in FIG. 11 or 12. The formation of the floating gate material may involve depositing a floating gate material layer on the structure shown in FIG. 11 or 12 (i.e., logic region), and then conducting a planarization process (e.g., CMP) to remove an excess of the floating gate material layer to a level that uppermost surfaces of the first, second and third STI structures 241, 242, 243 are exposed, so as to obtain the floating gate material. After formation of the floating gate material, an etching process will be performed on both the flash device region and the logic region to partially remove the floating gate material on the flash device region and to fully remove the floating gate material on the logic region. Because the semiconductor device of this disclosure is less likely to form a divot in the DTI structure 32, and because an etching amount of the floating gate material on the flash device region is much greater than a thickness of the floating gate material on the logic region, the floating gate material is much less likely to be trapped in the DTI structure 32 and will be fully removed from the DTI structure 32, thereby improving the performance of the semiconductor device.

In some embodiments, additional features may be added in the semiconductor device obtained using the method 100 of this disclosure, and some features in the semiconductor device may be modified, replaced, or eliminated without departure from the spirit and scope of the present disclosure.

Figure 14:
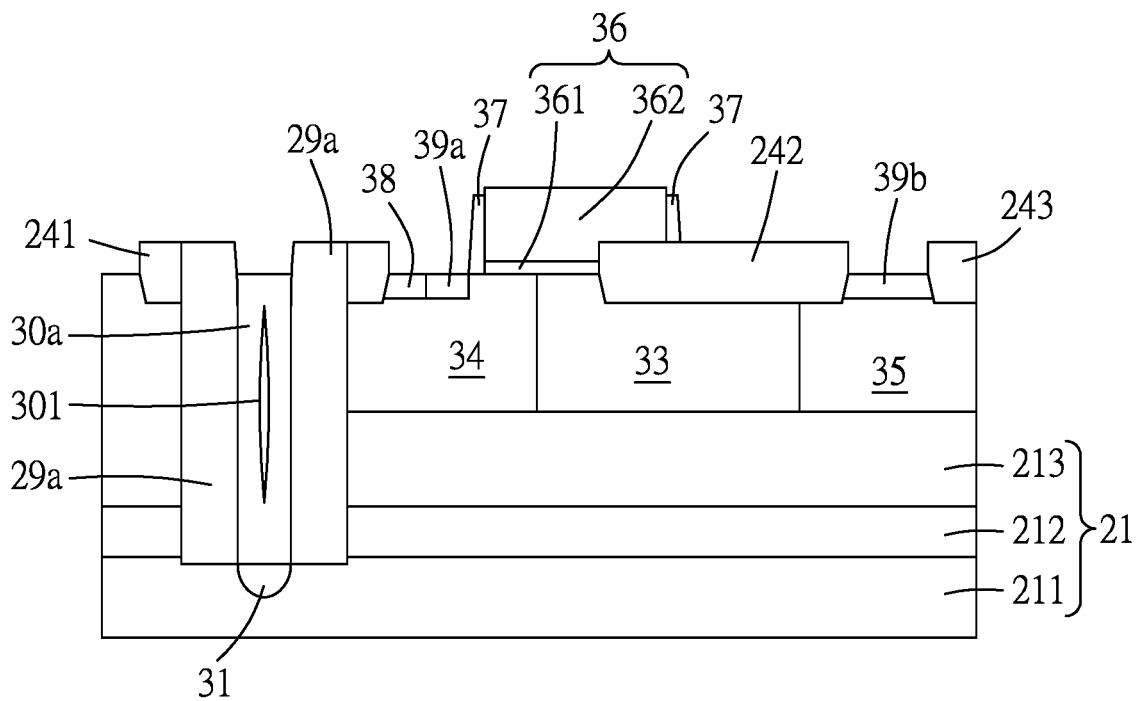
FIG. 14 is a schematic view illustrating a semiconductor device in accordance with some embodiments.

FIG. 14 illustrates a MOS device in accordance with some embodiments. The semiconductor structure shown in FIG. 14 may include the DTI structure 32 shown in FIGS. 11 and 12, well regions 33, 34, 35, a gate structure 36, two gate spacers 37, a doped region 38, a source region 39a, and a drain region 39b. The well regions 33, 34, 35 may be formed by ion implantation process or other suitable processes. In some embodiments, each of the well regions 33, 35 has a first type conductivity (i.e., each of the well regions 33, 35 is a first-type well region), and may be doped using an N-type dopant (for example, but not limited to, P, Sb, or As) for an N-type MOS device, or may be doped using a P-type dopant (for example, but not limited to, B, Al, or Ga) for a P-type MOS device. In some embodiments, the well region 34 is a second-type well region that has a second type conductivity, which is different from the first type conductivity of the well region 33. That is, when each of the well regions 33, 35 is N-type, the second type conductivity of the well region 34 is P-type, and vice versa. In some embodiments, the well region 33 may be a high voltage N-well (HVNW) region, the well region 34 may be a 5V P-well (5VPW) region, and the well region 35 may be a 5V N-well (5VNW) region. The gate structure 36 includes a gate dielectric 361 and a gate electrode 362. The gate dielectric 361 may include, for example, silicon oxide, and other suitable materials for the gate dielectric 361 are within the contemplated scope of the present disclosure. The gate electrode 362 is disposed to partially cover the second STI structure 242, and may include, for example, polysilicon, and other suitable materials for the gate electrode 362 are within the contemplated scope of the present disclosure. The gate structure 36 may be formed by (i) forming a dielectric layer (not shown) on the semiconductor substrate 21 by, for example, thermally oxidizing the upper semiconductor layer 213 in an oxygen-containing atmosphere, or using other suitable deposition techniques, (ii) depositing an electrode layer (not shown) over the dielectric layer, using, for example, CVD, PVD, ALD, or other suitable deposition techniques, and (iii) patterning the dielectric layer and the electrode layer. The gate spacers 37 are formed at two opposite sides of the gate structure 36, and may include, for example, but not limited to, silicon oxide or silicon nitride. Other suitable materials for the gate spacers 37 are within the contemplated scope of the present disclosure. The gate spacers 37 may be formed by (i) depositing a spacer material (not shown) over the structure obtained after formation of the gate structure 36 using, for example, CVD, PVD, ALD, or other suitable deposition techniques, and (ii) anisotropically etching (e.g., dry etching or other suitable etching techniques) the spacer material. Each of the source region 39a and the drain region 39b has the first-type conductivity while the doped region 38 has the second-type conductivity. The doped region 38 is formed in the second-type well region 34 at a position distal from the gate structure 36 and adjacent to the first STI structure 241. The source region 39a is formed in the second-type well region 34 at a position proximate to the gate structure 36. The drain region 39b is formed in the first-type well region 35 at a position between the second STI structure 242 and the third STI structure 243. The doped region 38, the source region 39a, and the drain region 39b may be formed by ion implantation process or other suitable processes.

In alternative embodiments, the method 100 may be used in forming other suitable devices which includes an upper inclined boundary between the conduction layer and the isolation layer and which involves etching back of the conduction layer and the isolation layer.

In sum, in the case that the conduction layer has an upper inclined boundary with the isolation layer, and that both of the conduction layer and the isolation layer are needed to be etched back to satisfy the specification of a semiconductor device to be produced, the isotropic etching back of the conduction layer may be formed after the anisotropic etching back of the isolation layer. Therefore, the semiconductor device obtained in this disclosure may not have a divot or have a relatively small divot. As such, the semiconductor device of this disclosure may have an improved performance and may be manufactured in a relatively low cost.

In accordance with some embodiments of the present disclosure, a method for eliminating divot formation includes: forming an isolation layer; forming a conduction layer which has an upper inclined boundary with the isolation layer such that the conduction layer has a portion located above a portion of the isolation layer at the upper inclined boundary; etching back the isolation layer; and etching back the conduction layer after etching back the isolation layer such that a top surface of the etched conduction layer is located at a level lower than a top surface of the etched isolation layer.

In accordance with some embodiments of the present disclosure, after etching back of the conduction layer, the etched isolation layer has an inclined lateral surface exposed from the etched conduction layer. An included angle between the inclined lateral surface and the top surface of the etched conduction layer is greater than 90 degrees and smaller than 135 degrees.

In accordance with some embodiments of the present disclosure, the included angle is in a range of 106 degrees to 118 degrees.

In accordance with some embodiments of the present disclosure, the isolation layer includes a dielectric oxide material and the conduction layer includes polysilicon.

In accordance with some embodiments of the present disclosure, the isolation layer is etched back using wet etching and the conduction layer is etched back using dry etching.

In accordance with some embodiments of the present disclosure, a method for manufacturing a semiconductor device includes: forming a shallow trench isolation (STI) structure located at a first substrate portion of a semiconductor substrate; forming a deep trench isolation (DTI) structure which is located in the STI structure and which extends through a second substrate portion of the semiconductor substrate, the second substrate portion being located beneath the first substrate portion, the DTI structure including a conduction layer and an isolation layer disposed to separate the conduction layer from the first and second substrate portions, the conduction layer having an upper inclined boundary with the isolation layer such that the conduction layer has a portion located above a portion of the isolation layer at the upper inclined boundary; etching back the isolation layer; and etching back the conduction layer after etching back the isolation layer such that a top surface of the etched conduction layer is located at a level lower than a top surface of the etched isolation layer.

In accordance with some embodiments of the present disclosure, after etching back of the conduction layer, the etched isolation layer has an inclined lateral surface exposed from the etched conduction layer. An included angle between the inclined lateral surface and the top surface of the etched conduction layer is greater than 90 degrees and smaller than 135 degrees.

In accordance with some embodiments of the present disclosure, the included angle is in a range of 106 degrees to 118 degrees.

In accordance with some embodiments of the present disclosure, after etching back of the conduction layer, the etched isolation layer further has an interconnecting region which interconnects the inclined lateral surface and the top surface of the etched conduction layer, and which has a width in a range from 0 Å to 100 Å.

In accordance with some embodiments of the present disclosure, the isolation layer is etched using wet etching and the conduction layer is etched using dry etching.

In accordance with some embodiments of the present disclosure, the isolation layer is etched back until the top surface of the etched isolation layer is flush with a top surface of the STI structure.

In accordance with some embodiments of the present disclosure, the conduction layer is etched back until the top surface of the etched conduction layer is located at a same level as a top surface of the semiconductor substrate.

In accordance with some embodiments of the present disclosure, the isolation layer includes a dielectric oxide material and the conduction layer includes polysilicon.

In accordance with some embodiments of the present disclosure, a semiconductor device includes a semiconductor substrate, a shallow trench isolation (STI) structure, and a deep trench isolation (DTI) structure. The STI structure is located at a first substrate portion of the semiconductor substrate. The DTI structure is located in the STI structure, and extends through a second substrate portion of the semiconductor substrate which is located beneath the first substrate portion. The DTI structure includes a conduction layer and an isolation layer disposed to separate the conduction layer from the first and second substrate portions. A top surface of the isolation layer is located at a higher level than a top surface of the conduction layer, the isolation layer having an inclined lateral surface and an interconnecting region which interconnects the inclined lateral surface and the top surface of the conduction layer, and which has a width in a range from 0 Å to 100 Å.

In accordance with some embodiments of the present disclosure, an included angle between the inclined lateral surface of the isolation layer and the top surface of the conduction layer is greater than 90 degrees and smaller than 135 degrees.

In accordance with some embodiments of the present disclosure, the included angle is in a range of 106 degrees to 118 degrees.

In accordance with some embodiments of the present disclosure, the isolation layer includes a dielectric oxide material and the conduction layer includes polysilicon.

In accordance with some embodiments of the present disclosure, the semiconductor substrate includes an upper semiconductor layer, a lower semiconductor layer, and a buried insulation layer. The upper semiconductor layer has the first substrate portion and the second substrate portion. The lower semiconductor layer is disposed beneath the upper semiconductor layer. The buried insulation layer is disposed between the upper semiconductor layer and the lower semiconductor layer.

In accordance with some embodiments of the present disclosure, the DTI structure extends through the STI structure, the upper semiconductor layer and the buried insulation layer into the lower semiconductor layer.

In accordance with some embodiments of the present disclosure, a top surface of the STI structure is located above a top surface of the semiconductor substrate, the top surface of the isolation layer is flush with the top surface of the STI structure, and the top surface of the conduction layer is located at a same level as the top surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for eliminating divot formation, comprising:
   forming an isolation layer;
   forming a conduction layer which has an upper inclined boundary with the isolation layer such that the conduction layer has a portion located above a portion of the isolation layer at the upper inclined boundary;
   etching back the isolation layer; and
   etching back the conduction layer after etching back the isolation layer such that a top surface of the etched conduction layer is located at a level lower than a top surface of the etched isolation layer.

2. The method of claim 1, wherein, after etching back of the conduction layer, the etched isolation layer has an inclined lateral surface exposed from the etched conduction layer, an included angle between the inclined lateral surface and the top surface of the etched conduction layer being greater than 90 degrees and smaller than 135 degrees.

3. The method of claim 2, wherein the included angle is in a range of 106 degrees to 118 degrees.

4. The method of claim 1, wherein the isolation layer includes a dielectric oxide material and the conduction layer includes polysilicon.

5. The method of claim 1, wherein the isolation layer is etched back using wet etching and the conduction layer is etched back using dry etching.

6. A method for manufacturing a semiconductor device, comprising:
   forming a shallow trench isolation (STI) structure located at a first substrate portion of a semiconductor substrate;
   forming a deep trench isolation (DTI) structure which is located in the STI structure and which extends through a second substrate portion of the semiconductor substrate, the second substrate portion being located beneath the first substrate portion, the DTI structure including a conduction layer and an isolation layer disposed to separate the conduction layer from the first and second substrate portions, the conduction layer having an upper inclined boundary with the isolation layer such that the conduction layer has a portion located above a portion of the isolation layer at the upper inclined boundary;
   etching back the isolation layer; and
   etching back the conduction layer after etching back the isolation layer such that a top surface of the etched conduction layer is located at a level lower than a top surface of the etched isolation layer.

7. The method of claim 6, wherein, after etching back of the conduction layer, the etched isolation layer has an inclined lateral surface exposed from the etched conduction layer, an included angle between the inclined lateral surface and the top surface of the etched conduction layer being greater than 90 degrees and smaller than 135 degrees.

8. The method of claim 7, wherein the included angle is in a range of 106 degrees to 118 degrees.

9. The method of claim 7, wherein, after etching back of the conduction layer, the etched isolation layer further has an interconnecting region which interconnects the inclined lateral surface and the top surface of the etched conduction layer, and which has a width in a range from 0 Å to 100 Å.

10. The method of claim 6, wherein the isolation layer is etched using wet etching and the conduction layer is etched using dry etching.

11. The method of claim 6, wherein the isolation layer is etched back until the top surface of the etched isolation layer is flush with a top surface of the STI structure.

12. The method of claim 6, wherein the conduction layer is etched back until the top surface of the etched conduction layer is located at a same level as a top surface of the semiconductor substrate.

13. The method of claim 6, wherein the isolation layer includes a dielectric oxide material and the conduction layer includes polysilicon.

14. A method for manufacturing a semiconductor device, comprising:
   forming a shallow trench isolation (STI) structure located at a first substrate portion of a semiconductor substrate;
   forming a deep trench isolation (DTI) structure which extends through the STI structure in the first substrate portion and extends through a second substrate portion of the semiconductor substrate, the second substrate portion being located beneath the first substrate portion, the DTI structure including a conduction layer and an isolation layer disposed to separate the conduction layer from the STI structure and the first and second substrate portions, the conduction layer having an upper inclined boundary with the isolation layer such that the conduction layer has a portion located above a portion of the isolation layer at the upper inclined boundary;
   etching back the isolation layer; and
   etching back the conduction layer after etching back the isolation layer such that a top surface of the etched conduction layer is located at a level lower than a top surface of the etched isolation layer.

15. The method of claim 14, wherein the STI structure has a height ranging from 240 Å to about 360 Å.

16. The method of claim 14, wherein a top surface of the STI structure is located above a top surface of the semiconductor substrate.

17. The method of claim 14, wherein forming the STI structure includes:
   sequentially forming a pad oxide layer and a first nitride layer on the semiconductor substrate; and
   forming the STI structure which extends through the pad oxide layer and the first nitride layer into the first substrate portion of the semiconductor substrate.

18. The method of claim 17, wherein forming the DTI structure includes:
   sequentially forming a second nitride layer and a dielectric layer on the first nitride layer to cover the STI structure exposed from the first nitride layer;
   patterning the dielectric layer, the second nitride layer, the STI structure and the semiconductor substrate to form a deep trench;
   forming an insulating material layer on two opposite trench-defining walls of the deep trench;
   partially removing the insulating material layer such that portions of the insulating material layer on the patterned dielectric layer and on a bottom surface of the deep trench are removed;
   forming a conductive material layer to fill the deep trench after partially removing the insulating material layer; and
   removing an upper portion of the conductive material layer, the patterned dielectric layer, and an upper portion of the insulating material layer such that the insulating material layer is formed into the isolation layer, and the conductive material layer is formed into the conduction layer.

19. The method of claim 14, wherein, after etching back of the conduction layer, the etched isolation layer has an inclined lateral surface exposed from the etched conduction layer, an included angle between the inclined lateral surface and the top surface of the etched conduction layer being greater than 90 degrees and smaller than 135 degrees.

20. The method of claim 19, wherein, after etching back of the conduction layer, the etched isolation layer further has an interconnecting region which interconnects the inclined lateral surface and the top surface of the etched conduction layer, and which has a width in a range from 0 Å to 100 Å.

\* \* \* \* \*